(12) United States Patent
Cooijmans

(10) Patent No.: US 9,337,404 B2
(45) Date of Patent: May 10, 2016

(54) SUBSTRATE FOR MOUNTING A PLURALITY OF LIGHT EMITTING ELEMENTS

(75) Inventor: Huib Cooijmans, Son en Breugel (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/004,762

(22) PCT Filed: Mar. 12, 2012

(86) PCT No.: PCT/IB2012/051148
§ 371 (c)(1),
(2), (4) Date: Sep. 12, 2013

(87) PCT Pub. No.: WO2012/127355
PCT Pub. Date: Sep. 27, 2012

(65) Prior Publication Data
US 2014/0001498 A1 Jan. 2, 2014

(51) Int. Cl.
*H01L 33/60* (2010.01)
*H01L 25/075* (2006.01)
*H05K 1/02* (2006.01)
*H01L 33/48* (2010.01)
*H01L 33/58* (2010.01)
*F21V 5/00* (2015.01)
*F21V 17/12* (2006.01)
*F21Y 101/02* (2006.01)

(52) U.S. Cl.
CPC ............ *H01L 33/60* (2013.01); *H01L 25/0753* (2013.01); *H05K 1/0278* (2013.01); *F21V 5/007* (2013.01); *F21V 17/12* (2013.01); *F21Y 2101/02* (2013.01); *H01L 33/486* (2013.01); *H01L 33/58* (2013.01); *H01L 2924/0002* (2013.01); *H05K 2201/09063* (2013.01); *H05K 2201/09263* (2013.01); *H05K 2201/10106* (2013.01); *H05K 2203/167* (2013.01)

(58) Field of Classification Search
CPC ............................. H01L 33/60; H01L 25/0753
See application file for complete search history.

(56) References Cited

U.S. PATENT DOCUMENTS

| 5,040,868 A | 8/1991 | Waitl et al. | |
| 5,811,874 A * | 9/1998 | Lee | 257/666 |
| 7,348,604 B2 | 3/2008 | Matheson | |
| 2004/0037079 A1 * | 2/2004 | Luk | 362/252 |

(Continued)

FOREIGN PATENT DOCUMENTS

| EP | 0117606 A1 | 9/1984 |
| EP | 0649041 A1 | 4/1995 |

(Continued)

*Primary Examiner* — Matthew Reames

(57) ABSTRACT

The present invention relates to a substrate (1) comprising: a first segment (5a) provided with a first contact pad (22a) for connection of a first light emitting element (2a); and a second segment (5b) provided with a second contact pad (22b) for connection of a second light emitting element (2b), wherein the substrate is provided with at least one through-hole (6a-c) that extends from an edge (8,9) of the substrate to a point within the substrate, such that a relative movement, in a plane of the substrate, can be achieved between the first segment (5a) of the substrate and the second segment (5b) of the substrate by applying a mechanical force to the substrate. This makes very accurate alignment to a multiple cavity optical system possible without adjusting the optics, thereby enabling a more convenient and time efficient process in production.

10 Claims, 7 Drawing Sheets

(56) References Cited

U.S. PATENT DOCUMENTS

| | | |
|---|---|---|
| 2007/0098334 A1 | 5/2007 | Chen |
| 2008/0130137 A1* | 6/2008 | Angelini et al. ............. 359/708 |
| 2008/0218984 A1* | 9/2008 | Togashi ....................... 361/749 |
| 2008/0239716 A1* | 10/2008 | Lin .............................. 362/219 |
| 2009/0251918 A1 | 10/2009 | Engl et al. |
| 2010/0224950 A1* | 9/2010 | Dinyari et al. ............... 257/441 |

FOREIGN PATENT DOCUMENTS

| | | | |
|---|---|---|---|
| JP | U5-95074 | * | 5/1992 |
| JP | 2000-124978 | * | 4/2000 |
| NL | 9000279 A | * | 9/1991 |
| WO | 2010004503 A1 | | 1/2010 |

\* cited by examiner (Prior art) *Fig. 1*

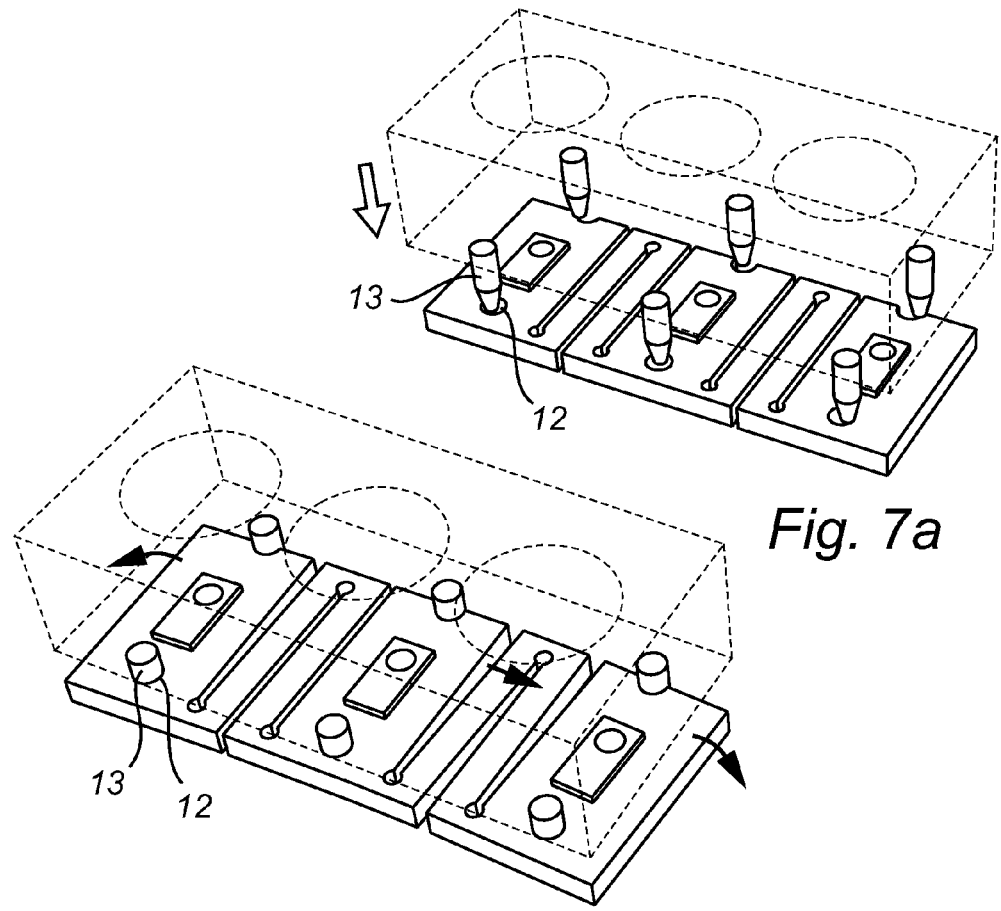
*Fig. 7a*
*Fig. 7b*
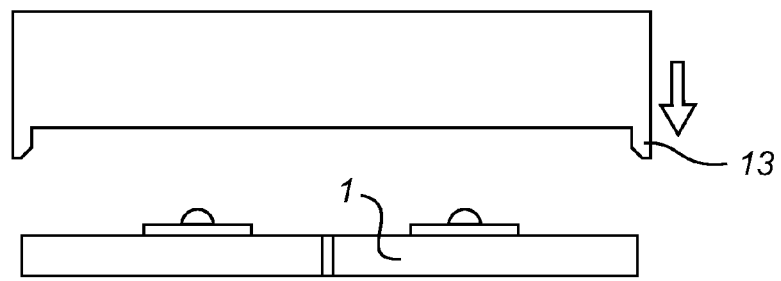
*Fig. 7c*

SUBSTRATE FOR MOUNTING A PLURALITY OF LIGHT EMITTING ELEMENTS

FIELD OF THE INVENTION

The present invention relates to a substrate for mounting a plurality of light emitting elements, and to a method of manufacturing such a substrate. The present invention also relates to a light output device comprising such a substrate, and to a method of assembling such a light output device.

BACKGROUND OF THE INVENTION

Today light emitting elements that are mounted on a substrate, such as light emitting diodes (LEDs) mounted on a printed circuit board (PCB), are increasingly used in illumination devices. To generate a desired beam shape, such an LED-based illumination device may often comprise an optical system with an optical element, such as a collimator, arranged for each of the LEDs. As an example thereof, a known illumination device 100, where an optical system 101 with multiple collimators 102 is arranged over a plurality of LEDs 103 mounted on a PCB 104, is schematically illustrated in FIG. 1.

To optimize the performance of the optical system in FIG. 1, each of the LEDs must be aligned to its respective collimator. This can be done by adjusting the collimator, or, if each LED is mounted on a separate printed circuit board (PCB), by adjusting the position of the printed circuit board on which the LED is arranged. However, to facilitate assembly and/or exchangeability of the LEDs, it is often preferred to use one printed circuit board with multiple LEDs arranged thereon. Therefore, after the LEDs have been mounted on the printed circuit board, the LEDs have fixed position relative to each other. This means the only alignment that is left in the optical system is the adjustment of the collimators, which can be a very inconvenient and time spending process in production.

Thus, there is a need to facilitate the alignment of light emitting elements to their respective optical elements, even though the light emitting elements are mounted on the same substrate.

SUMMARY OF THE INVENTION

It is an object of the present invention to overcome this problem, and to facilitate alignment of light emitting elements to their respective optical elements, even though the light emitting elements are mounted on the same substrate.

According to an aspect of the invention, this and other objects are achieved by a substrate comprising: a first segment provided with a first contact pad for connection of a first light emitting element; and a second segment provided with a second contact pad for connection of a second light emitting element, wherein the substrate is provided with at least one through-hole that extends from an edge of the substrate to a point within the substrate, such that a relative movement, in a plane of the substrate, can be achieved between the first segment of the substrate and the second segment of the substrate by applying a mechanical force to the substrate.

The present invention is based on the realization that by providing at least one through-hole that extends from an edge of the substrate to a point within the substrate, it is possible to enhance the flexibility of a rigid substrate, such that different segments of the substrate can be moved relative each other in the plane of the substrate. The inventor has further realized that appropriate arrangement of such through-holes allows a relative movement, in the plane of the substrate, between a first contact pad for connection of a first light emitting element and a second contact pad for connection of a second light emitting element, in response to a mechanical force applied to the substrate. Thereby, it is possible to change a relative position between first and second light emitting elements (which are fixedly mounted to the first and second contact pads), allowing each of the first and second light emitting elements to be aligned to a respective optical element. This makes very accurate alignment to a multiple cavity optical system possible without adjusting the optics, thereby enabling a more convenient and time efficient process in production. Further, as the light emitting elements are arranged on a single substrate it still allows easy assembly and/or exchangeability compared to a design where the light emitting elements are arranged on separate substrates.

As is recognized by a person skilled in the art, the shape and size of the through-hole may vary. However, the through-hole may preferably have an elongated shape, such as a substantially straight elongate groove, channel, or slit that penetrates through the plane of the substrate.

The substrate may be provided with a plurality of through-holes, each of the through-holes extending from an edge of the substrate to a point within the substrate. By increasing the number of through-holes enhanced flexibility can be achieved. The flexibility is also enhanced by increased length of the through-hole.

According to an embodiment, the through-hole(s) may be L-shaped. An L-shaped through-hole allows segments on opposite sides thereof to be moved in both dimensions of the plane of the substrate. This makes it easier to adjust the position of the light emitting element along any desired direction in the plane of the substrate, and thereby facilitates alignment.

A subset of the plurality of through-holes may extend from a first edge of the substrate, whereas the rest of the through-holes may extend from a second edge of the substrate opposite the first edge.

An end of the through-hole located within the substrate may preferably have a rounded shape. An advantage with a rounded shape is that the stress is distributed over a larger area of the substrate during flexure, thereby reducing the risk that the substrate breaks.

The substrate may be a (rigid) electrically non-conducting substrate provided with electrical track(s) that provides electrical connection to the contact pads, such as a printed circuit board (PCB). The electrical track and the contact pads may e.g. be etched on a printed circuit board, or discrete elements that may be attached by e.g. an adhesive. An advantage is that conversion of a conventional substrate, such as a printed circuit board, into a flexible substrate enables a cost-efficient solution.

Furthermore, the substrate according to the present invention may advantageously be included in a light output device, further comprising a first light emitting element connected to the first contact pad; and a second light emitting element connected to the second contact pad.

The light output device may further comprise an optical system provided with a first optical element intended to receive light from the first light emitting element, and a second optical element intended to receive light from the second light emitting element, wherein each of the first and second light emitting elements can be aligned with its respective optical element by applying a mechanical force to the substrate.

The substrate and the optical system may include corresponding sets of reference elements adapted to mate during alignment, so that a more accurate alignment can be achieved.

The set of reference elements on the substrate may be a set of reference holes, and the set of reference elements on the optical system may be a corresponding set of protrusions adapted to mate with the reference hole(s). This solution is typically easier in production, compared to a solution where the substrate has the protrusions and the optical element has the reference holes. The protrusion(s) may be tapered, or have a chamfered edge, such that the protrusion pushes the different segments of the substrate into the right positions, when the protrusion(s) of the optical system are introduced into the reference hole(s).

According to another aspect of the invention, there is provided a method of manufacturing a flexible substrate, comprising the steps of: providing a substrate comprising a first segment provided with a first contact pad for connection of a first light emitting element; and a second segment provided with a second contact pad for connection of a second light emitting element;

forming at least one through-hole that extends from an edge of said substrate to a point within said substrate, such that a relative movement, in a plane of the substrate, can be achieved between the first segment of the substrate and the second segment of the substrate by applying a mechanical force to said substrate.

This aspect provides similar advantages as discussed in relation to the previous aspect.

The formation of the through-hole(s) in the substrate may include making a (circular) through-hole in the substrate and making a cut from the through-hole to the edge of the substrate. In this way it is possible to form a through-hole that is wider at the inner end of the through-hole, such that the stress is distributed over a larger area of the substrate during flexure, thereby reducing the risk that the substrate breaks. However, the through-hole may also be produced in other ways, e.g. the through-hole(s) can be punched or milled to achieve a desired shape.

The method may include the step of providing a set of reference elements in the substrate. The reference element(s) facilitates alignment of the light emitting elements to their respective optical elements.

Furthermore, the method of manufacturing a substrate according to the present invention may advantageously be included in a method of assembling a light output device, further comprising the steps of: mounting a first light emitting element to the first contact pad on the substrate and a second light emitting element to the second contact pad on the substrate.

The method may further comprise the steps of: providing an optical system provided with a first optical element intended to receive light from the first light emitting element, and a second optical element intended to receive light from the second light emitting element; arranging the optical system over the light emitting elements; and aligning each of the first and second light emitting elements with its respective optical element by applying a mechanical force to the substrate. During alignment a set of reference elements on the optical system may be mated with a corresponding set of reference elements on the substrate.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIG. 7a-c schematically illustrates alignment between the light emitting elements and their respective optical elements.

DETAILED DESCRIPTION

Figure 1:
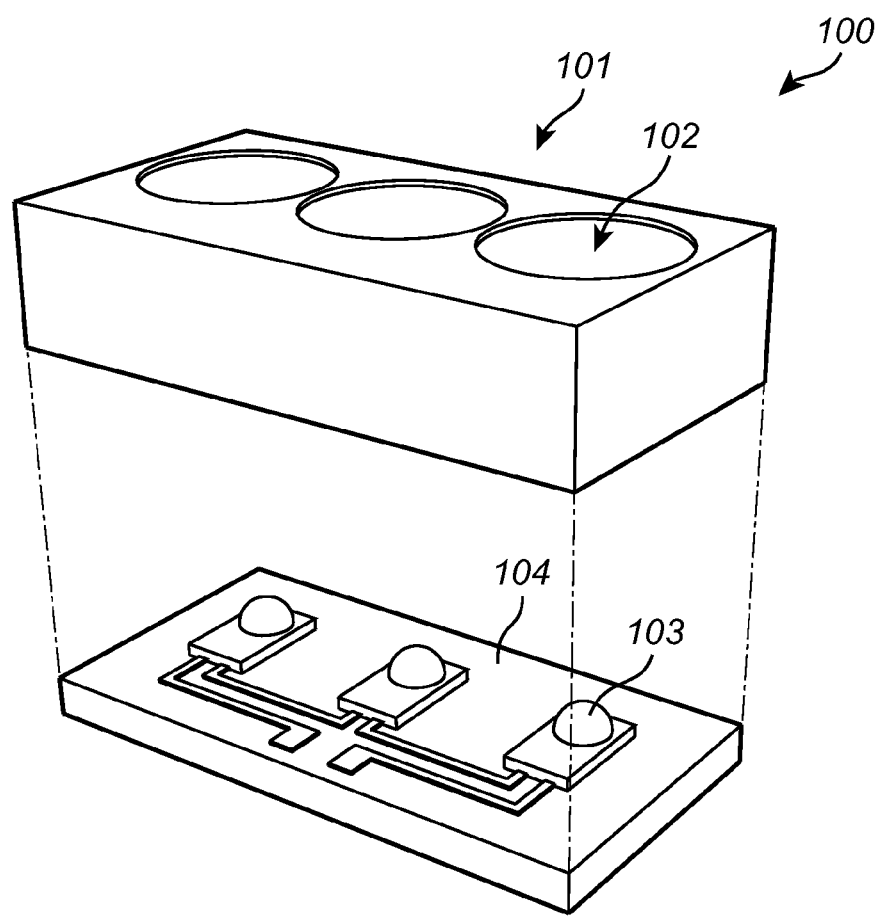
FIG. 1 schematically illustrates an LED-based illumination device with a optical system with multiple collimators according to prior art.
Figure 2:
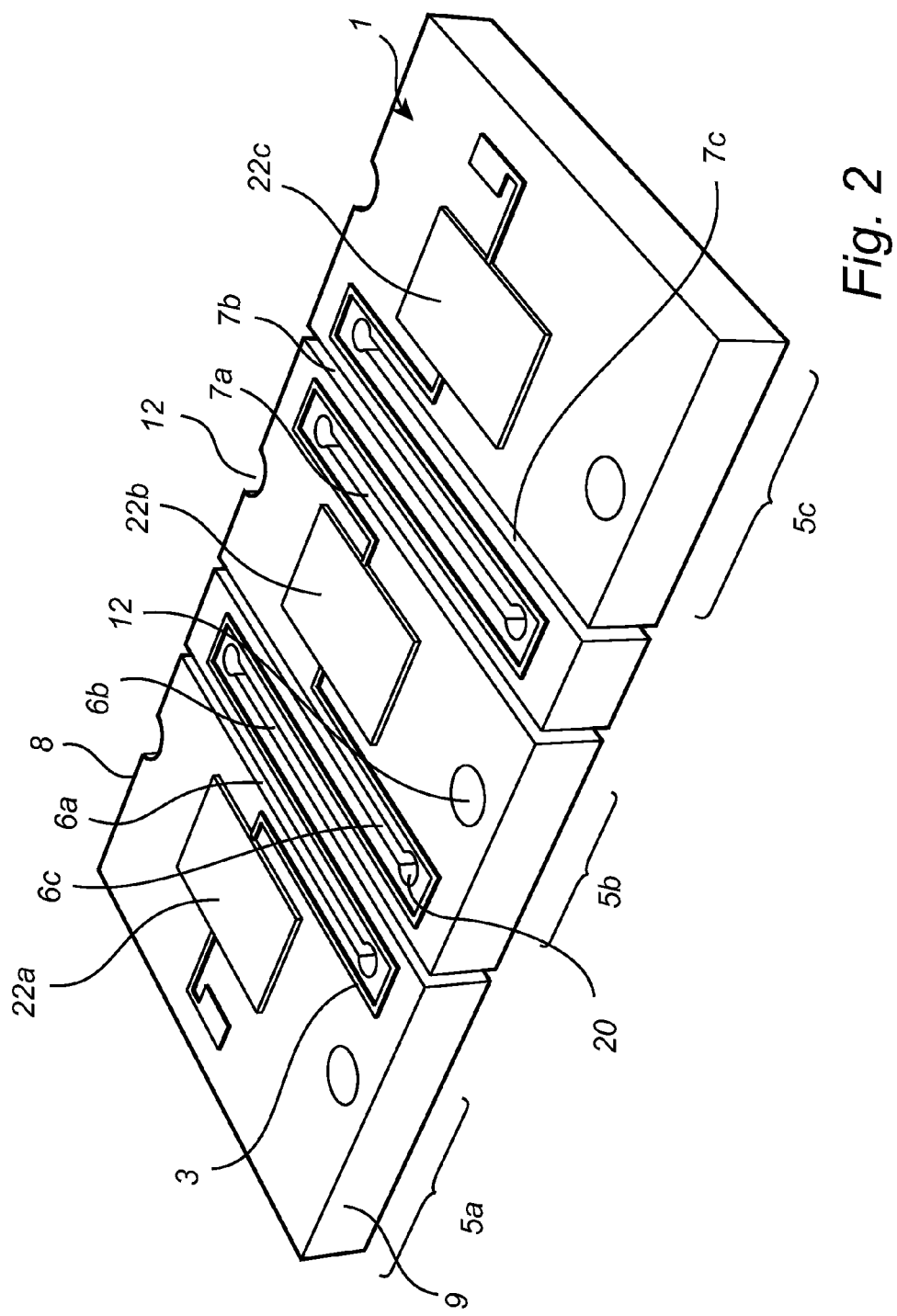
FIG. 2 schematically illustrates a substrate according to an embodiment of the invention.

FIG. 2 schematically illustrates a substrate 1 according to an embodiment of the invention. The substrate 1 can be a (rigid) electrically non-conducting substrate comprising a first segment 5a provided with a first contact pad 22a for connection of a first light emitting element, and a second segment 5b provided with a second contact pad 22b for connection of a second light emitting element. Optionally, the substrate may include additional contact pads such that more light emitting elements can be connected to the substrate. For instance, in the illustrated example in FIG. 2, there is a third contact pad 22c for connection of a third light emitting element to a third segment 5c of the substrate. The substrate can also include electrically conductive path(s) 3 within and/or fabricated on the substrate to connect the contact pads in any desired configuration. This can be achieved, e.g. by using a conventional printed circuit board (PCB), such as e.g. an IMS-board (MCPCB), or a FR4-board.

The substrate 1 is provided with a first set of through-holes 6a-c that extends from an edge 8,9 of the substrate to a point 20 within the substrate, in such a way that a relative movement, in the plane of the substrate, can be achieved between the first segment 5a of the substrate and the second segment 5b of the substrate. Thus, the arrangement is such that a portion of the substrate located at the inner end 20 of each through-hole will act as a flexible hinge that allows relative movement, in the plane of the substrate, between adjacent segments 5a-b in response to a mechanical force applied to the segments 5a-b.

Although it may suffice with a single through-hole 6a-c, it is often preferred to provide additional through-holes for increased flexibility. For instance, in the example illustrated in FIG. 2, there are three through-holes 6a-c arranged in-between the first contact pad 22a and the second contact pad 22b. Each through-hole, here has a straight elongate shape, such as a groove, channel, or slit that penetrates through the substrate. To reduce the risk that the substrate breaks when flexed the through-hole may preferably have a rounded shape at the inner end 20 of the through-hole.

Moreover, adjacent through-holes preferably extend from opposite edges of the substrate. For instance, in the example illustrated in FIG. 2, the first set of through-holes 6a-c has two of the through-holes 6a,6c extending from a first edge 8, and the third through-hole 6b, located in-between the two other through-holes, extending from a second edge 9 of the substrate, opposite the first edge.

As is recognized by a person skilled in the art, additional set(s) of through-holes may be formed in the substrate if there are additional contact pads that should be movable in relation to the other contacts pads. For instance, in the illustrated example in FIG. 2, there is a second set of through-holes 7a-c that extends from an edge 8,9 of the substrate to a point within the substrate, such that the third contact pad 22c is moveable in relation to the second contact pad 22b. This allows relative movement, in the plane of the substrate, between all of the contact pads 22a-c on the substrate.

Figure 3A:
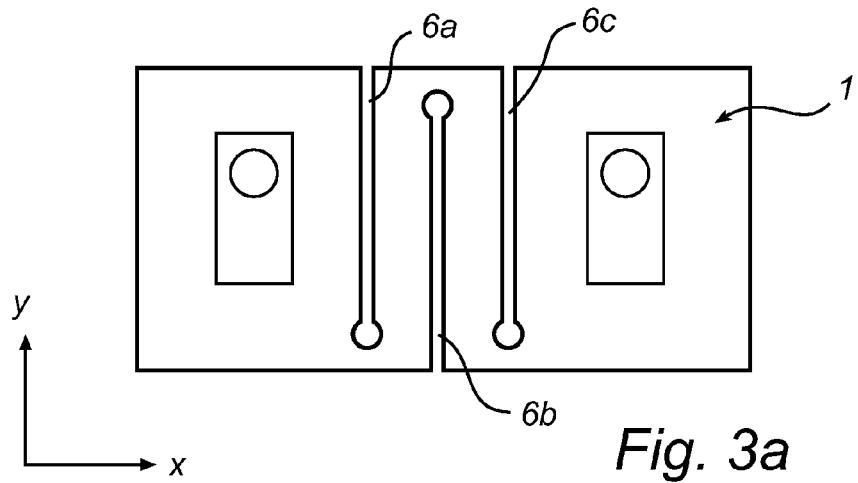
FIG. 3 a-c schematically illustrates various configurations of through-holes that achieve a one-dimensional flexibility.
Figure 3B:
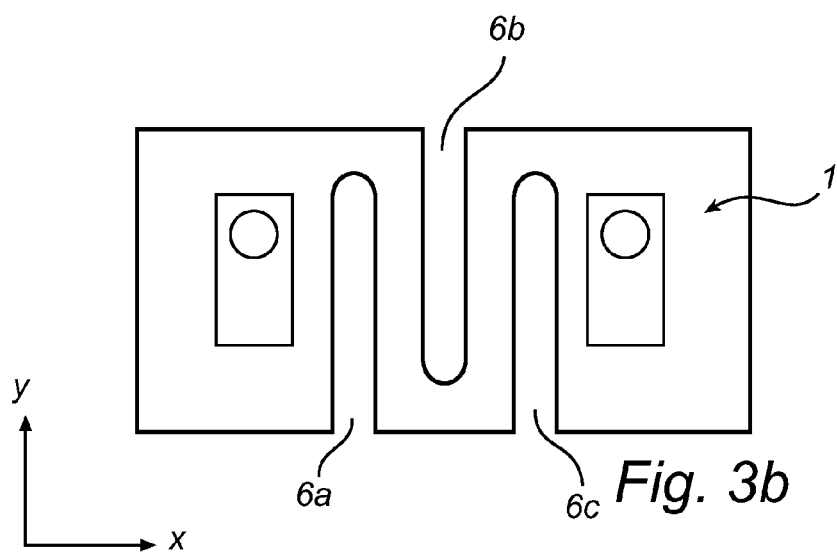
Figure 3C:
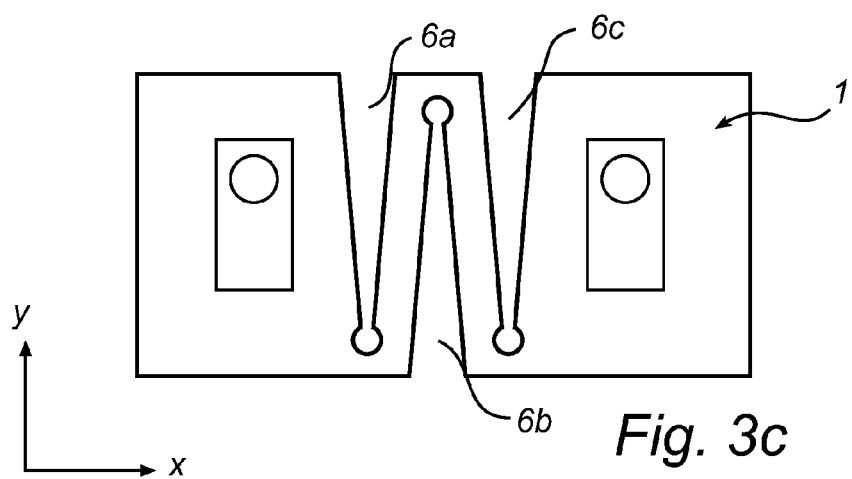

The through-holes illustrated in FIG. 2 and FIG. 3a, primarily enable (one-dimensional) relative movement between the segments along a first direction (illustrated as x-direction in FIG. 3a) substantially perpendicular to the extension of the through-holes. As is recognized by a person skilled in the art, the desired effect can be achieved also for other shapes of the through-hole. Two examples of alternatively shaped through-holes that achieve one-dimensional relative movement between the segments are illustrated in FIG. 3b-c.

Figure 4:
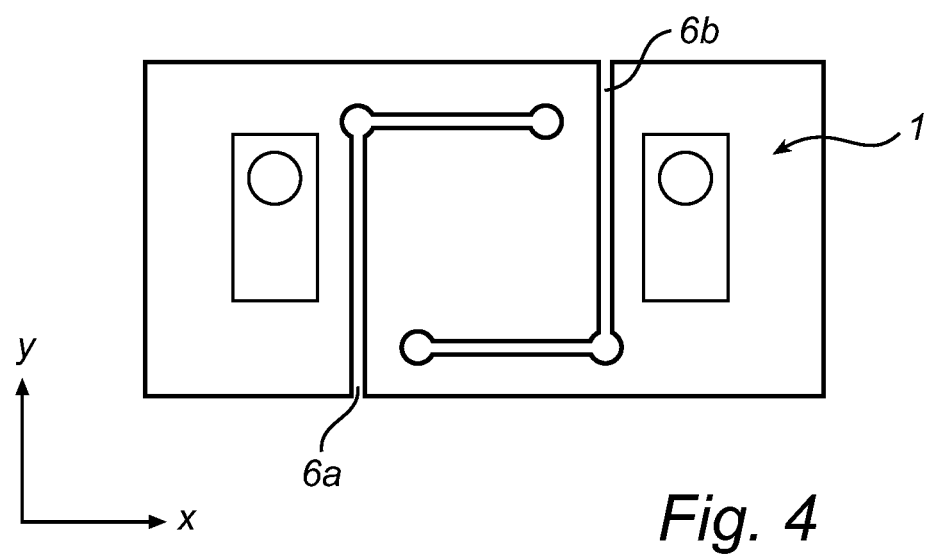
FIG. 4 schematically illustrates a configuration of through-holes that achieves a two-dimensional flexibility.

It is also possible to design the through-hole(s) such that segments of the substrate on opposite sides of the through-hole(s), can be moved relative each other, in both dimensions of the plane of the substrate (illustrated as x- and y-directions in FIG. 4). This can be achieved by using one or more L-shaped (6a-b) through-holes as illustrated in FIG. 4.

Figure 5:
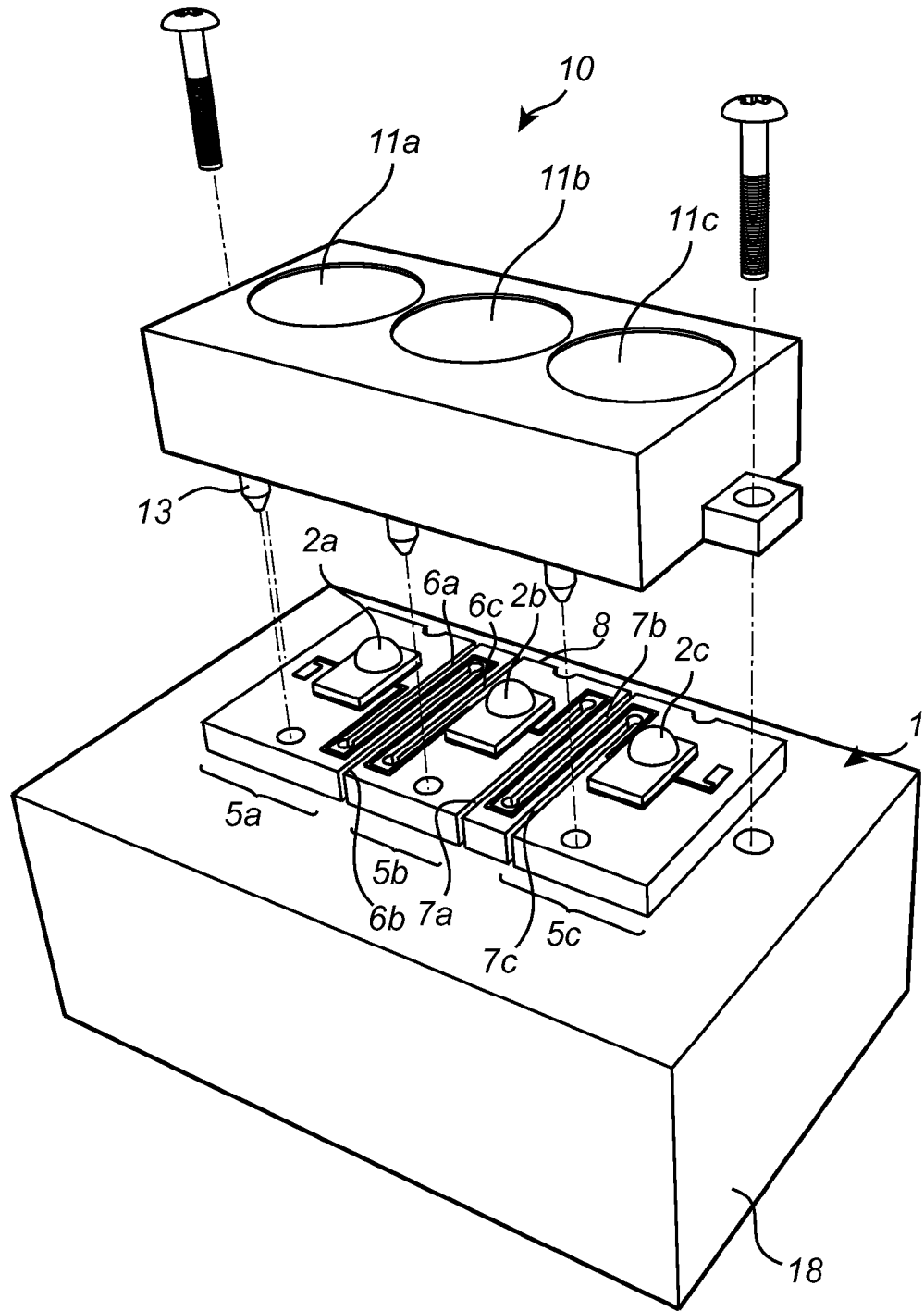
FIG. 5 schematically illustrates a light output device according to an embodiment of the invention.

FIG. 5 schematically illustrates a light output device according to an embodiment of the invention.

Here, the light output device comprises the substrate 1 described above in relation to FIG. 2. A first light emitting element 2a is electrically and thermally connected to the first contact pad 22a on the substrate 1, and a second light emitting element 2b is electrically and thermally connected to the second contact pad 22b on the substrate. In the illustrated example in FIG. 5, there is also a third light emitting element 2c connected to the third contact pad 22c on the substrate. Each light emitting element can be a light emitting diode (LED), such as a chip or die mounted directly on the contact pad. The light output device may also comprise components required for driving and controlling the light emitting elements.

The light output device can further comprise an optical system 10 arranged over the light emitting elements. The optical system comprises a first optical element 11a intended to receive light from the first light emitting element 2a, and a second optical element 11b intended to receive light from the second light emitting element 2b. Optionally, the optical system may include additional optical elements intended to receive light from additional light emitting elements. For instance, in the illustrated example in FIG. 3, there is a third optical element 11c intended to receive light from the third light emitting element 2c.

The optical elements are here collimating reflectors. Each collimating reflector can use a reflective surface (e.g. as a cavity provided with a reflective surface) or be based on total internal reflection (TIR) (e.g. by using a body portion made of polycarbonate or PMMA) as is well-known in the art.

Preferably, the substrate 1 and the optical system 10 are provided with corresponding sets of reference elements 12, 13 to ensure proper alignment of the optical elements 11a-c to the light emitting elements 2a-c on the substrate. For instance, the optical system can include one or more protrusions 13 (e.g. pins) mating with one or more corresponding reference holes 12 in the substrate, or vice versa. The reference elements are preferably arranged near the light emitting elements to ensure sufficient accuracy.

Optionally, the substrate can be thermally connected to a heat dissipation element 18, such as a heat sink.

Upon operation of the light output device, current is supplied to the light emitting elements via the electrically conductive traces of the substrate, whereby the light emitting elements emit light. The radiation pattern of the emitted light may be shaped by the optical components of the optical system. Here, the emitted light is collimated. Further, heat generated by the light emitting elements can be transferred by direct thermal contact from the substrate to the heat sink, for cooling of the light emitting elements.

Figure 6:
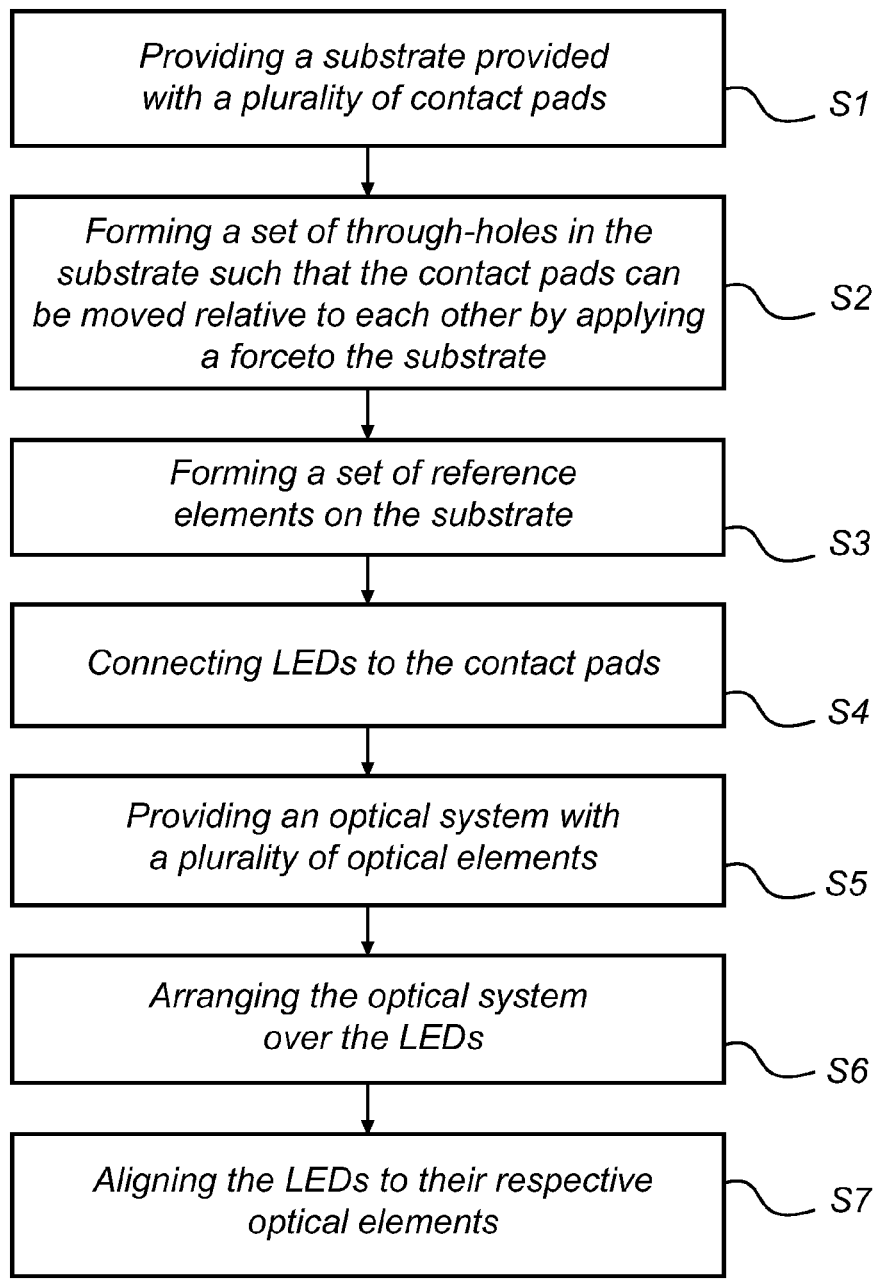
FIG. 6 is a flow chart showing the steps of producing a light output device according to an embodiment of the invention.

A method of manufacturing a flexible substrate according to an embodiment of the present invention will now be described with further reference to the flow chart in FIG. 6.

In step S1, a (rigid) electrically non-conducting substrate 1 is provided. The substrate comprises a first segment 5a provide with a first contact pad 22a for connection of a first light emitting element 2a, and a second segment 5b provided with a second contact pad 22b for connection of a second light emitting element 2b. The substrate may include electrically conductive path(s) within and/or fabricated on the substrate to connect various components on the board in desired configurations. The substrate may typically be a conventional printed circuit board (PCB), such as e.g. an IMS-board (MCPCB), or a FR4-board.

In step S2, a set of through-holes 6a-c is formed in the substrate. The through-holes 6a-c extends from an edge of the substrate to a point within the substrate, and are arranged in such a way that relative movement, in the plane of the substrate, between the first segment 5a of the substrate and the second segment 5b of the substrate can be achieved in response to a mechanical force applied to the substrate. For instance, each through-hole can be formed by making an initial (circular) through-hole 20, in the substrate and then make a cut (that penetrates the plane of the substrate) from the initial through-hole 20 to the edge of the substrate. However, the through-holes can also be formed in other ways, such as by punching out or milling, and may take other shapes. Further, it is noted that the electrical layout has been designed so that the electrical tracks 3 runs along the small bridges of the substrate that are formed between the edges 8,9 of the substrate and the inner end 20 of the through-holes.

Preferably, in step S3, a set of reference elements 12 are formed in the substrate. Each reference elements may e.g. be a reference hole 12, in the substrate adapted to receive a corresponding protrusion 13 in the optical system. The reference elements are preferably arranged near the light emitting elements.

A method of assembling a light output device according to an embodiment of the present invention will now be described with reference to FIG. 6.

In step S4, light emitting elements, such as light emitting diodes (LEDs), are mounted to the contact pads of the substrate manufactured according to step S1-S3. Thus, the first light emitting element 2a is connected to the first contact pad on the substrate, and the second light emitting element 2b is connected to the second contact pad. This can be achieved by arranging the substrate in a soldering jig (not shown) and connecting the light emitting elements to the contact pads by means of soldering. It is noted that the light emitting elements are mounted at a predetermined position relative the reference elements. Thus, to enhance the accuracy, and ensure that each light emitting elements is mounted at its intended position on the substrate (relative to the reference elements 12 in the substrate), the soldering jig is preferably provided with a set of reference elements (e.g. protrusions, or pins) that corresponds to the reference elements 12 on the substrate, and to the reference elements used by the optical system.

In step S5, an optical system 10 with a plurality optical elements 11a-b is provided. The optical system here comprises a first optical element 11a intended to receive light from the first light emitting element 2a, and a second optical element 11b intended to receive light from the second light emitting element 2b.

In step S6, the optical system 10 is arranged over the light emitting elements 2a-b.

In step S7, each light emitting element is aligned to its corresponding optical element by individually adjusting the position of each light emitting element in the plane of the substrate, by applying a force to the segments 5a-b of the substrate. As illustrated in FIG. 7a-b, this can be achieved by using tapered protrusions 13 on the optical system that cause the different segments of the substrate to move into their proper positions (i.e. the position where the light emitting element is aligned with its corresponding optical element), when the protrusions 13 of the optical system is introduces into the reference holes 12 in the substrate. As illustrated in FIG. 7c, the optical system may also have a protrusion with a chamfered edge that presses on the edge of the substrate when the optical system is arranged over the light emitting elements.

The displacement of the light emitting elements that are possible during alignment may vary, and depends on the length and the number of through-holes. Typically, it may be possible to change the distance between two adjacent light emitting elements by about ±0.5 mm, or more.

The person skilled in the art realizes that the present invention by no means is limited to the preferred embodiments described above. On the contrary, many modifications and variations are possible within the scope of the appended claims. For example, it is not limited to an optical system with collimating reflectors, but the above described invention may beneficially be used in all applications that use light emitting elements on a substrate, where individual alignment of the light emitting elements with optical component(s), such as lenses, TIR optics or light guides, is desired. The light output device may be used in a variety of applications such as e.g. automotive head/tail light and spot lights.

The invention claimed is:

1. A light output device, comprising a substrate having:
   a first segment provided with a first contact pad and a first light emitting element connected to the first contact pad; and
   a second segment provided with a second contact pad and a second light emitting element connected to the second contact pad,
   the substrate defining at least one through-hole that extends from an edge of said substrate to a point within said substrate, wherein said light output device further comprises an optical system comprising a first optical element for receiving light from the first light emitting element, and a second optical element for receiving light from the second light emitting element,
   wherein said substrate and said optical system include corresponding sets of reference elements, wherein said sets of reference elements and said at least one through-hole are positioned and structured such that application of a mechanical force through mating of said sets of reference elements induces a relative movement, in a plane of the substrate, between the first segment of the substrate and the second segment of the substrate,
   wherein each of the first and second light emitting elements are arranged to align with the first and second optical elements, respectively, through the application of the mechanical force.

2. The light output device according to claim 1, wherein the at least one through-hole is a plurality of through-holes, wherein each of said through-holes extends from a respective edge of said substrate to a respective point within said substrate.

3. The light output device according to claim 2, wherein a subset of said plurality of through-holes extends from a first edge of said substrate, whereas the rest of the plurality of through-holes extends from a second edge of said substrate opposite said first edge.

4. The light output device according to claim 1, wherein the at least one through-hole is L-shaped.

5. The light output device according to claim 4, wherein an end of the at least one through-hole located within said substrate has a rounded shape.

6. The light output device according to claim 5, wherein the substrate is a non-conducting substrate provided with at least one electrical track that provides electrical connection to the contact pads.

7. The light output device according to claim 1, wherein the set of reference elements on said substrate are a set of reference holes, and the set of reference elements on said optical system are a corresponding set of protrusions adapted to mate with said reference holes.

8. The light output device according to claim 7, wherein said set of protrusions is tapered.

9. The light output device according to claim 1, wherein the at least one through-hole is disposed between the first segment and the second segment.

10. A light output device, comprising a substrate having:
    a first segment provided with a first contact pad and a first light emitting element connected to the first contact pad; and
    a second segment provided with a second contact pad and a second light emitting element connected to the second contact pad,
    the substrate defining at least one through-hole that extends from an edge of the substrate to a point within the substrate, wherein the light output device further comprises an optical system comprising a first optical element for receiving light from the first light emitting element, and a second optical element for receiving light from the second light emitting element,
    wherein each of the first and second light emitting elements are arranged to mate and align with the first and second optical elements, respectively,
    wherein the at least one through-hole are positioned and structured such that mating of the first and second optical element with the first and second light emitting elements, respectively, induces a relative movement, in a plane of the substrate, between the first segment of the substrate and the second segment of the substrate.

* * * * *